United States Patent [19]

Fisher et al.

[11] Patent Number: 5,135,880
[45] Date of Patent: Aug. 4, 1992

[54] METHOD OF MANUFACTURING A SEMICONDUCTOR DEVICE

[75] Inventors: Carole A. Fisher, Horley; David H. Paxman, Redhill; Philip H. Bird, Sidcup, all of England

[73] Assignee: U.S. Philips Corporation, New York, N.Y.

[21] Appl. No.: 203,662

[22] Filed: Jun. 7, 1988

[30] Foreign Application Priority Data

Jun. 8, 1987 [GB] United Kingdom ............... 8713382

[51] Int. Cl.$^5$ ................ H01L 21/336; H01L 27/088
[52] U.S. Cl. ..................................... 437/44; 437/56; 437/58; 437/186
[58] Field of Search ............... 437/34, 40, 41, 44, 437/56, 57, 58, 186, 27, 28, 29, 30; 357/23.3, 23.9, 23.12, 59 G

[56] References Cited

U.S. PATENT DOCUMENTS

| Re. 28,704 | 2/1976 | Robinson et al. | 437/45 |
|---|---|---|---|
| 3,898,105 | 8/1975 | Mai et al. | 437/41 |
| 4,033,026 | 7/1977 | Pashley | 437/41 |
| 4,104,784 | 8/1978 | Klein | 437/44 |
| 4,294,002 | 10/1981 | Jambotkar et al. | 437/56 |
| 4,315,781 | 2/1982 | Henderson | 437/56 |
| 4,329,186 | 5/1982 | Kotecha et al. | 437/44 |
| 4,342,149 | 8/1982 | Jacobs et al. | 437/56 |
| 4,904,614 | 2/1990 | Fisher et al. | 437/41 |

Primary Examiner—Mary Wilczewski
Attorney, Agent, or Firm—Paul R. Miller

[57] ABSTRACT

A method of manufacturing a semiconductor device including both an enhancement (1) insulated gate field effect transistor (IGFET) and a depletion (2) mode IGFET is described. Impurities are introduced into a first region or epitaxial layer (4) of one conductivity type adjacent a given surface (3a) of a semiconductor body (3) to provide, for both the enhancement mode (1) and for the depletion mode (2) IGFET, a second region (5) of the opposite conductivity type adjacent the given surface, a source region (9) of a first conductivity type adjacent the given surface (3a) and surrounded by the second region (5) and a drain region (10) of the first conductivity type having a relatively lightly doped drain extension region (11) adjacent the given surface and extending toward the source region (9). First and second insulated gates (12) are provided on first and second areas (31a) and (31b), respectively, of the given surface to provide a respective gate connection between each source region and the associated drain region (10). The relative doses of impurities introduced to provide the second regions (5) and the relatively lightly doped drain extensions (11) received by the first area (31a) and the second area (31b) are independently controlled so as to provide adjacent the first area (31a) a channel area (13) of a second conductivity type and adjacent the second area (31b) a channel area (13') of the first conductivity.

11 Claims, 5 Drawing Sheets

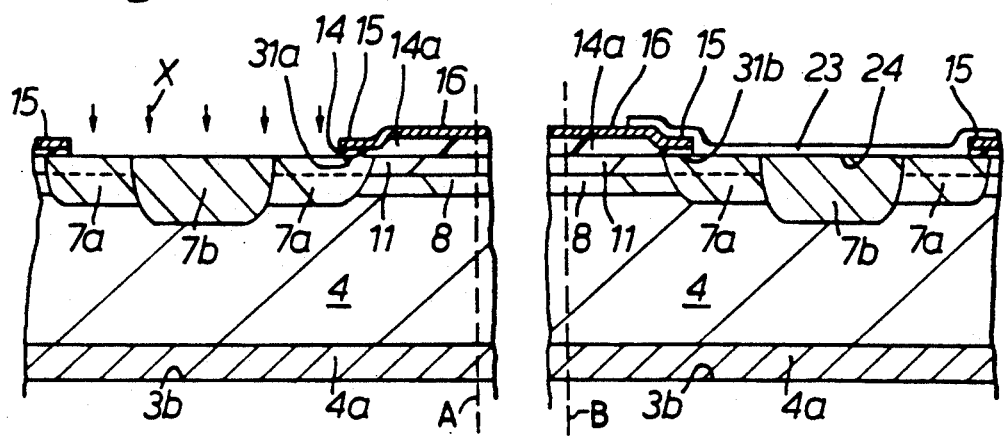
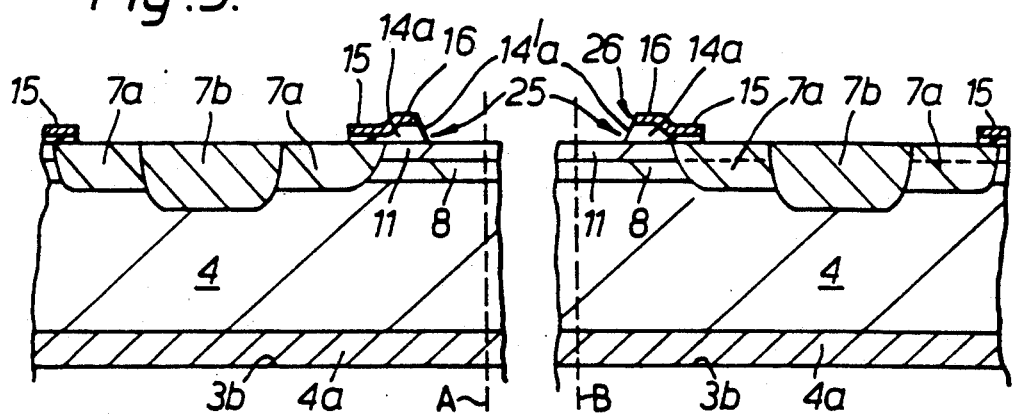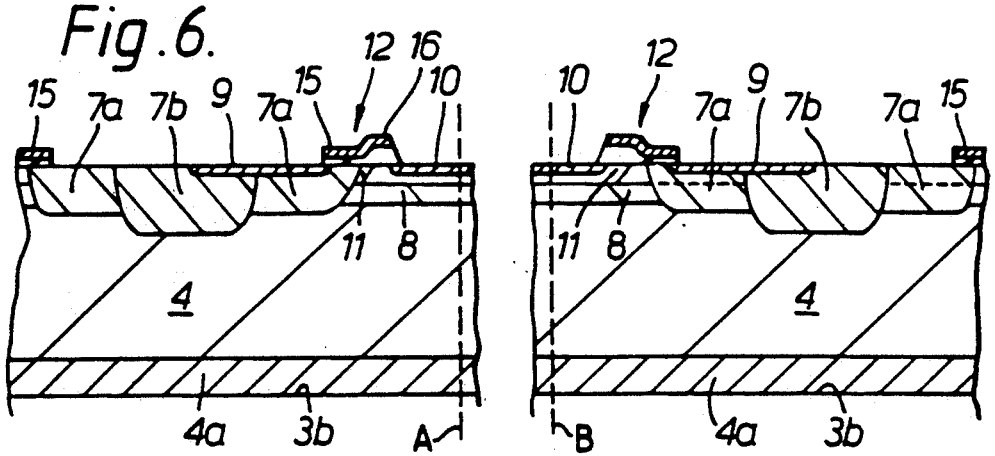

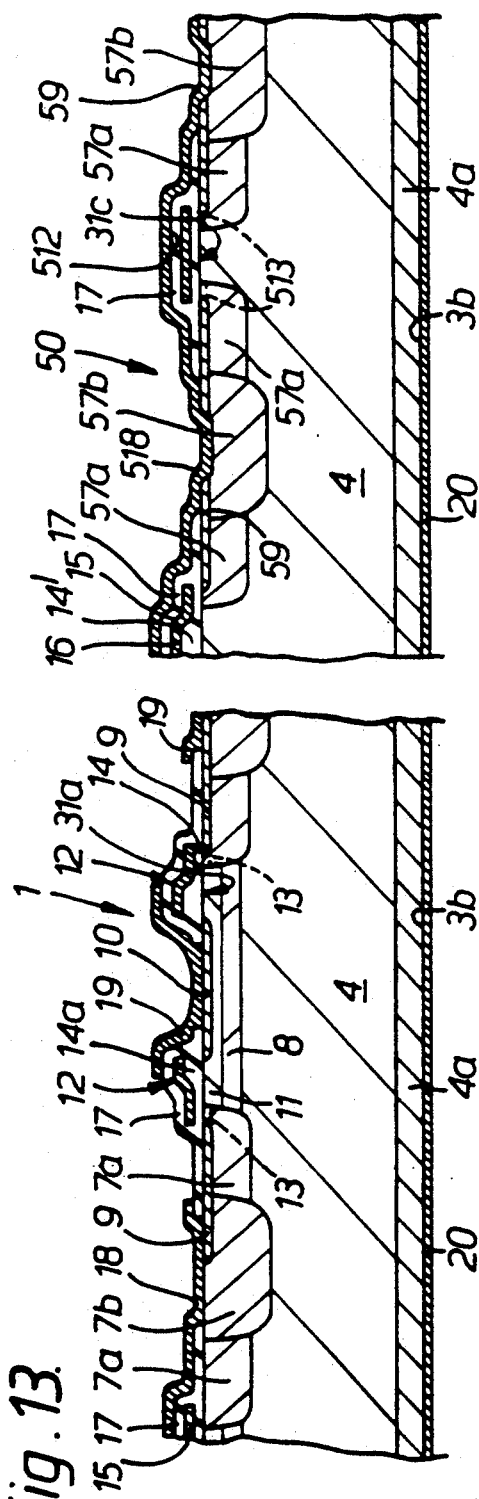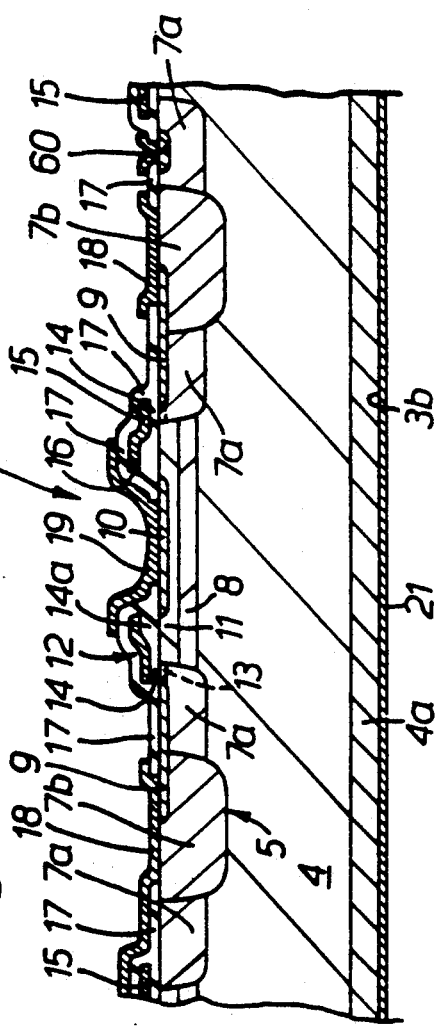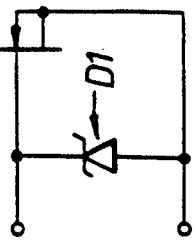

METHOD OF MANUFACTURING A SEMICONDUCTOR DEVICE

This invention relates to a method of manufacturing a semiconductor device comprising an enhancement mode insulated gate field effect transistor and a depletion mode insulated gate field effect transistor.

BACKGROUND OF THE INVENTION

A semiconductor device comprising enhancement and depletion mode insulated gate field effect transistors is described in a paper entitled 'Smart-SIPMOS- an intelligent power switch' by M. Glogolja and Dr. J. Tihanyj, published in the Conference Record of the 1986 IEEE Industry Applications Society Annual Meeting Part 1 at pages 429 to 433. As indicated in the title of the aforementioned paper, the semiconductor device described is an intelligent power switch, that is a semiconductor device in which one or more power semiconductor components are provided in or on the same semiconductor body as logic components for controlling and monitoring operation of the power semiconductor component and a load in circuit with the switch.

Such an intelligent power switch may, for example, be used as a high side switch in automotive and industrial control applications to control lights, electric motors, etc. Thus, for example, in combination with a simple bus system and central control unit such intelligent power switches may be used to replace the wiring loom of a motor vehicle. In such a situation the power supply to the intelligent power switch will be provided by the vehicle's battery.

The intelligent power switch described in the aforementioned paper comprises a vertical power MOSFET which forms the power switch and CMOS circuitry for controlling the operation of the power switch and for providing fault detection, for example detection of overvoltage or overtemperature problems. The CMOS circuitry includes low voltage complementary lateral IGFETs, high voltage P and N-channel enhancement IGFETs and high voltage depletion mode IGFETs.

SUMMARY OF THE INVENTION

The present invention aims to provide a method of manufacturing a semiconductor device comprising an enhancement and a depletion mode IGFET suitable for, although not specifically restricted to, use in the manufacture of an intelligent power switch, for example to form high voltage lateral enhancement and depletion mode IGFETS.

According to one aspect of the present invention, there is provided a method of manufacturing a semiconductor device comprising an enhancement mode insulated gate field effect transistor and a depletion mode insulated gate field effect transistor, which method is characterized by introducing impurities into a first region of a first conductivity type adjacent a given surface of a semiconductor body to provide, for the enhancement mode and for the depletion mode insulated gate field effect transistor, a second region of the second conductivity type adjacent the given surface, a source region of the first conductivity type adjacent the given surface and surrounded by the second region and a drain region of the first conductivity type having a relatively lightly doped drain extension region adjacent the given surface and extending towards the source region, and providing a first insulated gate on a first area of the given surface and overlying a channel area of a first subsidiary region of one of the second regions and a second insulated gate on a second area of the given surface and overlying a channel area of a first subsidiary region of the other of the second regions to provide a respective gate connection between each source region and the associated drain region, which method further comprises independently controlling, using masking means, relative doses of impurities introduced to provide the second regions and the relatively lightly doped drain extensions received by the first area and the second area so as to provide adjacent the first area a channel area of the second conductivity type and adjacent the second area a channel area of the first conductivity type.

A method embodying the invention thus enables enhancement and depletion mode insulated gate field effect transistors (IGFETs) to be provided simultaneously on the same semiconductor body without increasing or significantly increasing the number of processing steps beyond that required to produce one type of IGFET by using masking means to separately or independently control the relative doses of impurities received by the first and second areas.

Impurities may be introduced to provide a further subsidiary region of each second region extending from the associated first subsidiary region and the relatively lightly doped drain extension and drain regions for each IGFET may be provided within the further subsidiary regions thereby isolating the enhancement and depletion mode IGFETs from the first region. The further subsidiary region and the drain extension region may both act to increase the reverse breakdown voltage of the associated pn junction and may enable the lateral IGFETs to withstand high reverse voltages which, for example, may occur if the IGFETs form part of an intelligent power switch where, for example, a vertical power MOSFET is provided in the same semiconductor body, and the first region also forms the drain region of the power MOSFET.

The relative doses of impurities received by the first and second areas may be independently controlled by exposing both the first and second areas to the impurities for forming the relatively lightly doped drain extension region and by introducing the impurities to form the first subsidiary region of each second region in two or more steps and masking the second area of the given surface after the first step.

Thus in a relatively simple way the dose received by the second area of impurities for forming the first subsidiary region in combination with the dose received by the second area of the impurities for forming the relative lightly doped drain extension region provide a channel area of the first conductively type whereas the second introduction of impurities for forming the first subsidiary region (which is not received by the second area) causes the channel area of the second conductivity type to be provided adjacent the first area. The threshold voltage of the enhancement mode IGFET may be adjusted by adjusting the dose of impurities in the second step. In addition or alternatively the relative doses may be controlled by introducing the impurities to form the further subsidiary region of each second region in two or more steps and masking the second area of the given surface after the first step and/or by introducing the impurities to form the relatively lightly doped drain extension region of each insulated gate field effect transistor in two or more steps and masking the first area of the given surface after the first step.

Use of such a method enables the characteristics of a relatively lightly doped drain extension region and the further region of the second region, both of which may be RESURF regions, to be optimised, regardless of whether an enhancement or depletion mode IGFET is required, and allows the type of IGFET to be determined merely by the number of doses of the impurities introduced. Moreover, where the insulated gates are used as masks so that the source and first subsidiary regions are automatically aligned to the insulated gate edges, then this particular method of controlling whether or not an IGFET is an enhancement or depletion mode IGFET does not involve any critical alignment step.

The relative doses of impurities received by the first and second areas may be independently controlled by masking the area to provide the channel area of the enhancement IGFET throughout the introduction of the impurities to form the relatively lightly doped drain extension regions. In such an arrangement, the impurities introduced to form the relatively lightly doped drain extension regions are prevented from entering the area adjacent the first surface area which is to form the channel area of the enhancement mode IGFET but not the area which is to form the channel area of the depletion mode IGFET. Thus only geometric control of the relatively lightly doped drain extension regions is required so that where the relatively lightly doped drain extension regions and the second subsidiary regions mentioned above are RESURF regions, the characteristics of these regions can be optimised for the desired design and for the dose of impurities introduced to provide the first subsidiary regions. This method may of course be used in combination with the two-step method mentioned above of introducing the impurities to form the first subsidiary region and/or the further subsidiary region of each second region.

A method embodying the invention may comprise, for each insulated gate field effect transistor, providing the respective insulated gate by defining a relatively thick insulating layer over the drain extension region and a relatively thin insulating layer over the channel area and depositing electrically conductive material over the insulating material, the electrically conductive material extending onto the relatively thick insulating material providing a field plate for the drain region.

Impurities to provide the drain regions of the enhancement and depletion mode IGFETs may be introduced after providing the insulated gates on the given surface, by defining a respective window through the relatively thick insulating layer covering each drain extension region to enable impurities to be introduced to provide the drain regions, and introducing the impurities to provide the drain regions using the insulated gate as a mask. Such windows may be defined by an anisotropic etching technique such as a reactive ion etching technique after opening a window in the conductive layer. However, although this technique enables a good edge to be provided in the relatively thick insulating layer to enable each drain region to be self-aligned to the associated window in the conductive layer and to enable subsequent good coverage by a further insulating layer and metallisation, reactive ion etching techniques are both time-consuming and very expensive and are therefore not particularly suited to mass production. Therefore as an alternative to reactive ion etching, the step of defining a respective window through the relatively thick insulating layer covering each drain extension may comprise, for each insulated gate field effect transistor, opening a window in the conductive layer on the relatively thick region of the insulating layer, etching the insulating layer isotropically through the window in the conductive layer to form a window in the relatively thick region of the insulating layer thereby leaving part of the conductive layer overhanging the edge of the window in the insulating layer, selectively etching the conductive layer to remove the part overhanging the edge of the window in the insulating layer, and then introducing impurities to provide the drain regions of the enhancement and depletion mode insulated gate field effect transistors using the insulated gates as a mask. The relatively thick insulating material may be etched by a wet etching technique while the overhang may be selectively etched away using a plasma etching technique.

A method embodying the invention may comprise for each IGFET introducing impurities of the second conductivity type for providing a relatively deep highly doped central region of the first subsidiary region of the second region.

Where such a relatively deep region is provided, it can become difficult to precisely control the characteristics of the relatively lightly doped drain extension regions (and, if present, the further subsidiary regions of the second regions) unless these regions are introduced as the last of the implantation/diffusion steps which would necessarily require that the insulated gate be provided after all the diffusion processes had been completed preventing any possibility of the use of self-alignment to achieve precise channel lengths. However, where it is desired that such self-alignment techniques be used, a method embodying the invention may comprise, for each insulated gate field effect transistor, introducing impurities of the second conductivity type for providing a relatively deep highly doped central region of the first subsidiary region of the second region and causing the introduced impurities to partially diffuse into the semiconductor body, introducing the impurities for providing the relatively lightly doped drain extension region heating the semiconductor body in an oxidising atmosphere to cause the introduced impurities to diffuse into the semiconductor body to provide the relatively deep highly doped central region and the relatively lightly doped drain extension region and to grow the relatively thick insulating material on the given surface. The heating may be carried out first in a dry and then in a wet oxidising atmosphere. Such a method enables better control of the characteristics of the relatively lightly doped drain extension regions (and, if present, the further subsidiary regions of the second regions) while still allowing use of a self-alignment technique in which the impurities to form the relatively lightly doped drain extension region and the further subsidiary regions, if present, are introduced before provision of the insulated gates and the first subsidiary and source regions are then formed by introducing the appropriate impurities using the insulated gates as masks so that the first subsidiary and source regions are aligned to the insulated gates.

A method embodying the invention may comprise, for one or for each of the IGFETs, introducing impurities into the second region to provide a further region of the first conductivity type adjacent the given surface and spaced apart by the second region from the source region, providing an electrical connection between the further regions and the insulated gate and shorting the source region to the second region to provide a zener diode between the gate and the source of the IGFET. The impurities to provide the further region may be introduced at the same time as the impurities to form the source region.

A vertical insulated gate field effect transistor, for example a power MOSFET, may be provided at the same time as the enhancement and depletion mode IGFETs by introducing impurities into a third area of the given surface to provide a body region of the second conductivity type adjacent the given surface and a source region of the first conductivity type within the body region, and to provide an insulated gate overlying a first subsidiary region or channel area of the body region to provide a gate connection between the source region and the first region.

The present invention also provides a lateral insulated gate field effect transistor comprising a semiconductor body having a first region of the first conductivity type adjacent a given surface of the semiconductor body, a second region of the second conductivity type adjacent the given surface, the second region comprising a first subsidiary region and a relatively lightly doped further subsidiary region extending away from the first subsidiary region, a source region of the first conductivity type adjacent the given surface and surrounded by the first subsidiary region, a drain region of the first conductivity type adjacent the given surface spaced apart from the source region and surrounded by the second subsidiary region, a relatively lightly doped drain extension region adjacent the given surface and extending toward the source region within the relatively lightly doped further subsidiary region of the second region and an insulated gate overlying a channel area of the first subsidiary region to provide a gate connection between the source and drain regions.

The first subsidiary region, the source region and the drain region may be self-aligned to the insulated gate. The source region may be annular and surround the drain region. The insulated gate may comprise a relatively thin insulating layer overlying the channel area, a relatively thick insulating layer extending over the relatively lightly doped drain extension region to the drain region and a conductive layer extending on the insulating layers.

The relatively lightly doped drain extension and further subsidiary regions are provided to enable the IGFET to withstand high reverse voltages which makes it particularly suitable for use in an intelligent power switch while enabling the threshold voltage of the IGFET to be controlled as described above.

A further region of the first conductivity type may be provided in the second region adjacent the given surface and separated from the source region, the source region being shorted to the second region and an electrical connection provided between the insulated gate and the further region to provide a zener diode between the insulated gate and the second region.

BRIEF DESCRIPTION OF THE DRAWINGS

Embodiments of the invention will now be described, by way of example, with reference to the accompanying drawings, in which:

FIGS. 1,2,3,4,5,6 and 7 are schematic cross-sectional views partly cut-away, of a semiconductor body illustrating various steps in a first embodiment of a method in accordance with the invention for providing high voltage lateral enhancement and depletion IGFETs;

FIG. 13 is a schematic cross-sectional view, partly cut-away, of a semiconductor device comprising a lateral insulated gate transistor and a vertical insulated gate transistor and manufactured using a method in accordance with the invention;

FIG. 14 is a cross-sectional view of a modified lateral high voltage IGFET incorporating a zener diode; and FIG. 14a is a circuit diagram of the modified IGFET of FIG. 14;

Figure 1:
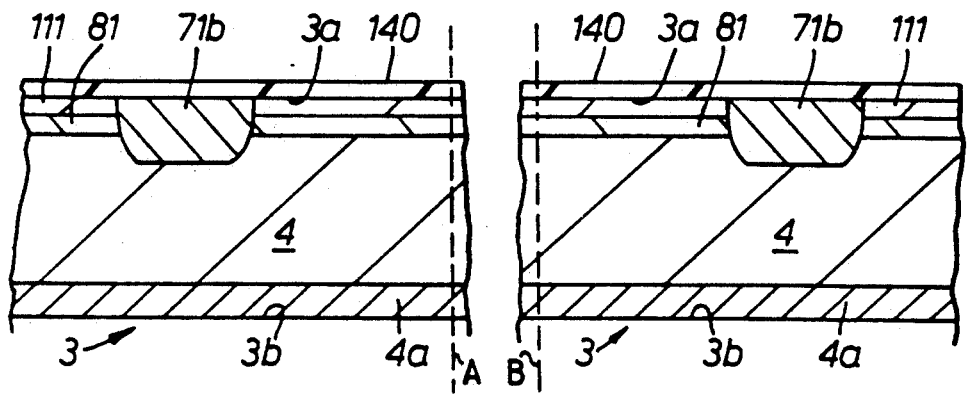

Referring now to the drawings, it should be understood that the Figures are merely schematic and are not drawn to scale. In particular certain dimensions such as the thickness of layers or regions may have been exaggerated whilst other dimensions may have been reduced. It should also be understood that the same reference numerals are used throughout the Figures to indicate the same or similar parts.

DESCRIPTION OF THE INVENTION

Figure 7:
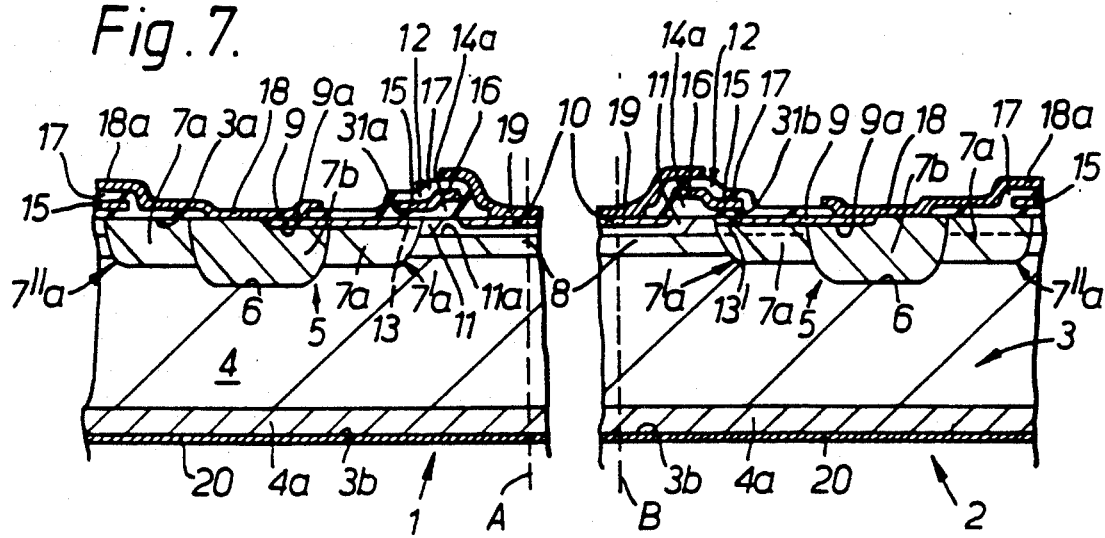

Referring now to FIG. 7, there is shown a semiconductor device embodying the invention in which both an enhancement and a depletion mode lateral insulated gate field effect transistor are provided. The enhancement mode insulated gate field effect transistor (IGFET) 1 is shown on the left hand side of FIG. 7 while the depletion mode IGFET 2 is shown on the right hand side in FIG. 7. Only part of each of the two IGFETS 1 and 2 is shown and it should be appreciated that each of the IGFETs 1 and 2 is symmetrical about a respective axis indicated by the dashed lines A and B, respectively, in FIG. 7.

The semiconductor device shown in FIG. 7 comprises a semiconductor body 3 of a first conductivity type, that is n-conductivity type in this example. The semiconductor body 3 comprises a lightly doped n-type epitaxial layer 4 provided on a highly doped n-type substrate 4a.

Referring now to the left hand side of FIG. 7, the enhancement mode IGFET 1 comprises a second region 5 of the second conductivity type (p type in the example) which meets a given surface 3a of the semiconductor body and which, given that the structure is symmetrical about the axis A, provides a well which forms a pn junction 6 with the epitaxial layer 4 so as to isolate the IGFET 1 from the epitaxial layer 4 for reasons which will be explained hereinafter.

The second region or well 5 comprises an outer or first subsidiary region 7a which is annular when viewed in plan and defines the periphery of the well and a relatively lightly doped further or central subsidiary region 8. It should be understood that, as used herein, the term 'annular' includes, for example, annuli of circular, elliptical, rectangular or other polygonal shapes with, the shape of the outer subsidiary region 7a when viewed in plan looking down onto the given surface 3a being determined by the desired geometry of the device.

The outer subsidiary region 7a is a relatively shallow region 7a and a more highly doped relatively deep region 7b is disposed centrally of the relatively shallow outer subsidiary region 7a to form with the outer subsidiary region 7a a body region 7.

The central subsidiary region 8 which extends between and adjoins the inner periphery 7'a of the outer subsidiary region 7a is sufficiently lightly doped and sufficiently thin so that the central subsidiary region 8 becomes fully depleted of free charge carriers in operation of the IGFET 1 before a reverse-biasing voltage across the pn junction 6 reaches the breakdown voltage of the pn junction 6. The central subsidiary region 8 thus acts to spread the depletion region of the reverse-biassed pn junction 6 laterally (i.e. along the surface 3a) and thereby reduces the electric field at the given surface 3a, to increase the breakdown voltage of the pn junction 6. Such a region is known as a RESURF (Reduced SURface Field) region and is described in detail in, for example, a paper entitled 'high voltage thin layer devices' (RESURF devices) by J. A. Appels et al published in Philips Journal of Research Vol 35 No 1 1980 at pages 1 to 13. As indicated in the aforementioned paper in order to function as a RESURF region, the product Nd of the thickness (or depth) d in cm and the doping concentration N in atoms $cm^{-3}$ of the region should be of the order of $2 \times 10^{12}$ atoms $cm^{-2}$.

A source region 9 of the first conductivity type (n+ type in this example where the plus sign indicates relatively high doping) is provided within and forms a pn junction 9a with the body region 7 adjacent the given surface 3a. As shown in FIG. 7, the source region is offset toward the inner periphery 7'a of the relatively shallow outer subsidiary region 7a and extends into the relatively deep region 7b. A drain region 10 of the first conductivity type (n+ type in this example) is similarly provided adjacent the given surface 3a in the central subsidiary region 8 so as to be spaced apart from the source region 9. As indicated above, in this example, the IGFET 1 is symmetrical about the axis A and therefore the source region 9 is annular and surrounds the drain region 10.

A lightly doped region 11 of the first conductivity type adjacent the given surface 3a provides an extension of the drain region 10 toward the source region 9. The lightly doped drain extension region 11 forms a further RESURF region which enables the IGFET 2 to withstand not only a high voltage between the drain region 10 and the substrate 4a but also a high voltage between the source and drain regions 9 and 10. As shown in FIG. 7, the drain region 10 lies wholly within the lightly doped drain extension region 11 and the region 11 forms a pn junction 11a with the central subsidiary region 8 of the second region.

An insulated gate 12 overlies a first area 31a of the given surface 3a so that the underlying relatively shallow outer subsidiary region 7a provides a channel area 13 which, under control, of a signal applied to the insulated gate 12, provides a gate connection between the source and drain regions 9 and 10. The insulated gate 12 comprises a relatively thin insulating layer 14 of, for example, silicon dioxide and an overlying electrically conductive gate layer 15 of, for example, doped polycrystalline silicon. The conductive gate layer 15 may however be a metal layer or a metal silicide layer or a composite of two or more of the afore-mentioned layers.

As shown in FIG. 7, the conductive gate layer 15 is stepped up over a relatively thick insulating layer 14a to provide a field plate 16 which, together with the lightly doped drain extension region 11 acts to help the IGFET 1 withstand high voltages between the source region 9 and drain region 10 and between the drain region 10 and the substrate 4a.

As illustrated in FIG. 7, the outer periphery 7"a of the second region 5 may be similarly covered with a relatively thin insulating layer 14 upon which is provided the conductive gate layer 15. Again, although not shown, the conductive gate layer 15 may be stepped up over a relatively thick insulating layer to provide a field plate for the periphery of the IGFET.

A further insulating layer 17 of silicon dioxide extends over the conductive gate layer 15. Metallisation, for example aluminium, is provided on the given surface 3a to provide electrical contacts 18 and 19 for the source and drain regions 9 and 10 respectively and to provide, via a window (not shown) opened in the insulating layer 17, an electrical contact (not shown) to the conductive gate layer 15.

For reasons which will be described hereinafter, metallisation 20 may also be provided on the surface 3b of the substrate 4a opposite the given surface 3a.

The depletion mode IGFET 2 shown on the right hand side in FIG. 7 differs from the enhancement mode IGFET 1 in that the doping of the channel area 13', which is adjacent a second area 31b of the given surface 3a, of the depletion mode transistor 2 is of the first conductivity type (n-type in this example) so that the depletion mode IGFET 2 is normally on until a gate signal is applied to pinch off the channel whereas the channel area 13 of the enhancement mode IGFET 1 is of the opposite conductivity type (p-type in this example) and so the IGFET 1 is normally off until the appropriate gate signal is applied to provide a surface inversion channel. This fact is illustrated in FIG. 7 by showing the channel area 13 of the normally off or enhancement IGFET 1 by a dashed line and the channel area 13' of the normally on depletion mode IGFET 2 by a solid line.

The doping of the channel area 13,13' of each of the lateral IGFETs 1 and 2 is determined as will be described below by controlling the relative proportions received by the first and second areas 31a and 31b at the given surface 3a of the impurities introduced to form the central and outer subsidiary regions 8 and 7a of the second region 5 and the lightly doped drain extension region 11.

A first embodiment of a method in accordance with the invention for manufacturing the lateral IGFETs 1 and 2 which illustrates one way of controlling the doping of the first and second areas 31a and 31b will now be described with reference to FIGS. 1 to 7.

Referring firstly to FIG. 1, a lightly doped n-type monocrystalline silicon epitaxial layer 4 having a resistivity of, typically, 1 to 5 ohm-cm is provided on a highly doped n-type monocrystalline silicon substrate 4a.

After cleaning to remove surface contaminants and to grow a protective layer of thermal silicon dioxide, p-type impurities are locally implanted into the semiconductor body 3 via the given surface 3a using an appropriate mask and are caused to diffuse partially into the semiconductor body 3 to provide two p-type regions 71b which, after subsequent processing, will form the relatively deep regions 7b of the two IGFETs 1 and 2. In this example, the p-type impurity used is boron with an implantation energy of 45 KeV (Kilo electron volts) and a dose of $5 \times 10^{14}$ atoms $cm^{-2}$ and the impurities are partially driven into the semiconductor body by heating the semiconductor body to a temperature of approximately 900 degrees Celsius in an inert, for example nitrogen atmosphere for about one minute.

P-type impurities are then implanted into the semiconductor body via the given surface 3a using an appropriate mask and subsequently n-type impurities are implanted through an appropriate subsequent mask to form regions 81 and 111 respectively which, after subsequent processing, will provide the central subsidiary regions 8 of the second regions 5 and the drain extension regions 11. In this example the p-type impurity used is boron with an implantation energy of 170 KeV and a dose of from $2 \times 10^{12}$ to $10 \times 10^{12}$ atoms cm$^{-2}$ while the n-type impurity is arsenic with an implantation energy of 170 KeV and a dose of from $1 \times 10^{12}$ to $5 \times 10^{12}$ atoms cm$^{-2}$.

The introduced impurities are then caused to diffuse into the semiconductor body by heating the semiconductor body. The heating is carried out in an oxidising atmosphere so that, as shown in FIG. 1, simultaneously with the diffusion, a relatively thick layer 140 of silicon dioxide is grown on the given surface 3a. In this particular example, the semiconductor body is heated to 1100 degrees Celsius in an oxidising atmosphere for 255 minutes to produce a relatively thick field oxide layer of approximately 0.8 micrometers (8000 Angstroms) thickness. The heat treatment in the oxidising atmosphere may comprise a first heating step in a dry oxygen atmosphere and a subsequent wet oxidising step in a wet oxygen atmosphere.

The relative duration of the dry and wet oxidising steps do not significantly affect the drive in of the impurities to form the relatively deep region 7b and, by adjusting the dose of impurities introduced to produce the central subsidiary regions 8 of the second regions 5 and the lightly doped drain extension regions 11 and by adjusting the relative durations of the wet and dry oxidation steps, the desired thickness of the relatively thick field oxide layer can be grown without detrimentally affecting the desired profile for the central subsidiary regions 8 and the lightly doped drain extension regions 11. For example, for a boron dose of $8 \times 10^{12}$ atoms cm$^{-2}$ and an arsenic dose of $3 \times 10^{12}$ atoms cm$^{-2}$, the dry oxidising step may last say 145 minutes and the wet oxidising step 105 minutes.

Figure 2:
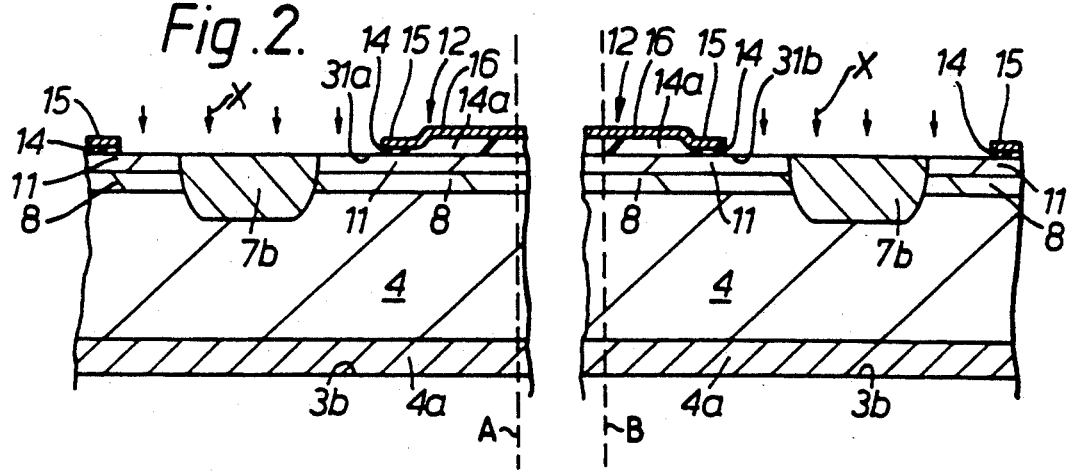

Referring now to FIG. 2, the field oxide or relatively thick insulating layer is then patterned or defined using a conventional photolithographic and etching technique to define the relatively thick insulating layer 14a. A relatively thin insulating layer of gate oxide is then grown on the given surface 3a.

Polycrystalline silicon is then deposited on the insulating layer 14, 14a providing the conductive layers 15, 16 and doped in a conventional manner, for example with arsenic, to provide the necessary conductivity. The doped polycrystalline silicon layer is then patterned or defined using conventional photolithographic and etching techniques to provide the insulated gate structure 12 shown in FIG. 2.

Figure 3:
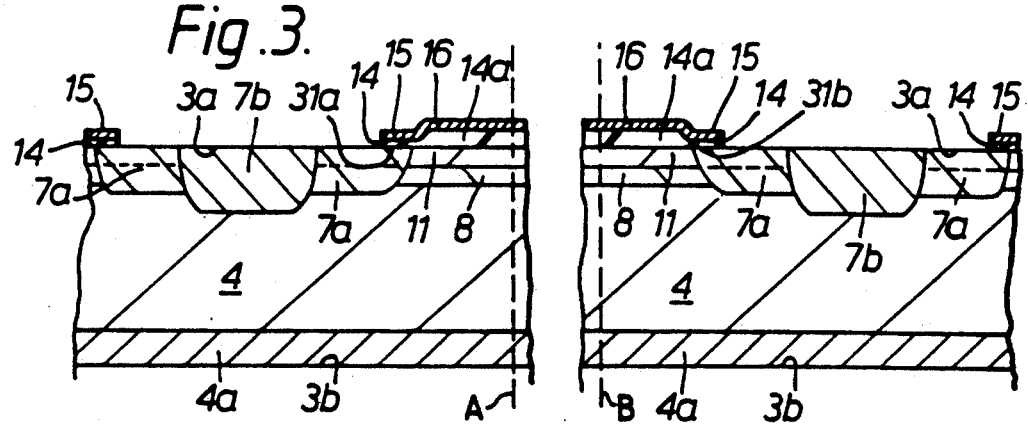

Using the insulated gate structure 12 as a mask, p-type impurities, in this example boron, are implanted into the semiconductor body 3 to provide the relatively shallow outer subsidiary regions 7a of the second regions 5 of the enhancement and depletion mode IGFETs 1 and 2. In this example, as illustrated by FIGS. 2, 3 and 4, the implantation of the p-type impurities is carried out in two stages. In the first stage impurities (indicated by the arrows X in FIG. 2) are implanted using only the insulated gate structures 12 as a mask so that impurities are introduced to form the relatively shallow outer subsidiary regions 7a of both the enhancement and the depletion mode IGFETs.

Then, as illustrated in FIG. 4, an appropriate mask 23 is provided over an exposed area 24 of the body region 7 to protect it against further implantations. For example, the exposed area 24 may be protected by a relatively thick deposited oxide layer. A second dose of p-type impurities is then, as indicated in FIG. 4, directed at the given surface 3a so as to increase the concentration of p-type impurities within the outer subsidiary region 7a of the second region 5 of only the structure shown on the left hand side in FIG. 4.

The first and second doses of p-type impurities are selected such that the first dose alone is not sufficient to cause the channel areas 13 and 13' to become predominantly p-type but the combination of the two doses is sufficient. Thus, as the first area 31a is exposed during both the first and the second implantation steps, a p-type channel area 13 will be provided adjacent the first area 31a whereas, because the second area 31b is protected against the second implantation step by the mask 23, an n-type channel area 13' will be provided adjacent the second area 31b. In this particular example the first and second implantation steps may both be of boron with an implantation energy of 180 KeV and a dose of $5 \times 10^{12}$ atoms cm$^{-2}$. The second step may however be adjusted so as to adjust the p-type doping of the channel area 13 and thus adjust the threshold voltage of the enhancement mode IGFET 1.

Using such a method enables the characteristics of the central subsidiary regions 8 and of the second regions 5 and of the lightly doped drain extension regions 11 to be optimised as well as the enhancement and depletion characteristics. Morever, since neither of the two p-type implantation steps is critical in alignment (both being self-aligned to the insulated gate structures 12), the method is relatively simple and should not affect alignment tolerances during manufacture.

The mask 23 is removed after the second p-type implantation step and it is then necessary to open windows 25 in the relatively thick insulating layers 14a to enable introduction of impurities to produce the drain regions 10. As shown in FIG. 5, this may be achieved by having first opened windows 26 in the polycrystalline silicon layer 15, 16 during the defining of the insulated gate structures 12, and then using a reactive ion etching technique to etch the windows 25 through the relatively thick insulating layers 14a as shown in FIG. 5.

Having opened the windows 25, a mask 35 is provided on the given surface to protect those areas of the body regions 7 where the source regions are not required and n-type impurities, in this example arsenic with an implantation energy of 80 KeV and a dose of $4 \times 10^{15}$ atoms cm$^{-2}$, are implanted into the given surface using the insulated gate structures 12 as a mask to produce the source and drain regions 9 and 10 of the enhancement and depletion mode IGFETs 1 and 2 (FIG. 6).

The further insulating layer 17, in this example of silicon dioxide, is then deposited onto the given surface 3a. Windows are then opened in the insulating layer 17 and metallisation, for example aluminium, deposited, as shown in FIG. 7, to form the source and drain contacts 18 and 19 and the gate contacts (not shown) of the IGFETs 1 and 2. The source contact metallisation extends outwardly over the insulating layer 17 beyond the outer peripheries 7"a of the body regions 7 to provide field plates 18a. Although not shown, the gate polycrystalline silicon layers 15, 16 may similarly extend outwardly beyond the outer peripheries 7"a up onto relatively thick insulating material to provide double field plate structures. Metallisation 20 may be provided on the surface 3b of the substrate 4a as indicated above.

Although the use of the reactive ion etching technique described above with reference to FIGS. 5 and 6 enables a good edge 14'a to be provided in each relatively thick insulating layer 14a to enable the respective drain region 10 to be self-aligned to the window 26 in the polycrystalline silicon layer 15, 16 and to enable subsequent good coverage by the further insulating layer 17 and the metallisation for the drain contact 19, reactive ion etching techniques for both are therefore not particularly suited to mass production. From the point of view of mass production, a wet etching technique is to be preferred. However, such a technique has problems, in particular, the isotropic wet etching of the relatively thick insulating layers 14a through the windows 26 results in back or under etching leaving a polycrystalline silicon overhang. Such an overhang is highly undesirable as it means that the subsequent insulating layer may virtually double back upon itself to follow round the overhang which not only may cause voids in the insulating layer but means that the subsequent aluminium is deposited onto a surface having sharp bends (following the polycrystalline silicon overhang) at which breaks in the aluminium track may occur. The present inventors however have developed a wet etching process which avoids such problems and which may therefore be used as an alternative to the anisotropic reactive ion etching process mentioned above.

Figure 8:
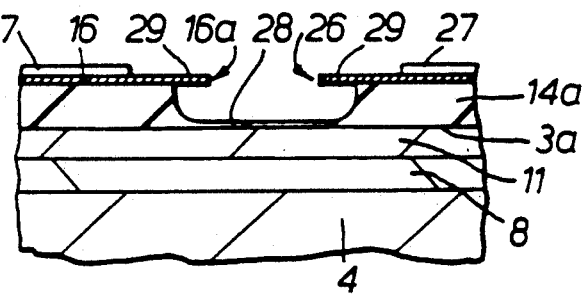
FIGS. 8,9 and 10 are schematic cross-sectional views of part of a semiconductor body illustrating a modification of the method illustrated by FIGS. 1 to 7.
Figure 9:
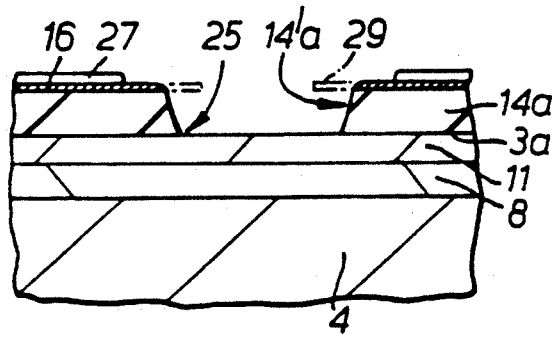
Figure 10:
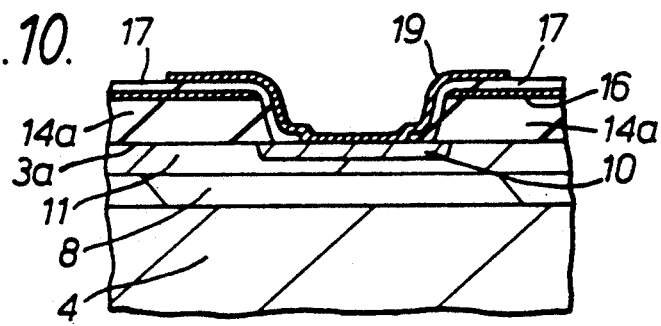

The modified method of etching a window 25 through a relatively thick insulating layers 14a is illustrated in FIGS. 8 to 10 for one of the IGFETs being formed although it will, of course, be appreciated that the same problem is applied simultaneously for the other IGFET being formed.

Thus, as shown in FIG. 8, the window 26 is first opened in the polycrystalline silicon layer 15, 16 using a photoresist mask and polycrystalline silicon etching process such as a plasma etching process. In this example, the plasma etching process used may be carried out in a conventional barrel reactor such as is available from Electrotech. The plasma used may be a carbon tetrafluoride plasma (containing about 8% oxygen) with a pressure of about 400 Torr ($5.3 \times 10^4$ Pa). The window 26 will normally be opened during the definition of the insulated gate structure 12, the relatively thick insulating layer 14a protecting the underlying silicon from the subsequent implantation step to form the relatively shallow outer subsidiary region 7a of the second region 5. A mask 27 is then provided on the polycrystalline silicon layer. As the mask 27 is required mainly to protect the insulated gate structure 12, alignment of the mask 27 to the window 26 is not required and as indicated the opening in the mask 27 may be considerably larger than the window 26. The insulating material 14a is then wet etched, using for example buffered HF, through the window 26 to a desired depth which leaves a thin layer 28, for example of 1000 Angstroms, of insulating material covering the surface 3a within the window 26 to protect the surface 3a.

As indicated in FIG. 8, the wet etching causes under or back etching of the relatively thick insulating layer 14a thereby leaving an overhang 29 of polycrystalline silicon which if left in place would, as indicated above, result in both the subsequent insulating layer 17 and metallisation 19 having to be provided on a very stepped surface which sharply doubles back on itself under the overhang.

What is of importance is that the subsequent drain region is aligned to the edge of the window in the polycrystalline silicon layer to facilitate preservation of the integrity of the associated lightly doped drain extension region 11. Accordingly after the insulating material 14a has been wet-etched as described above, the polycrystalline silicon overhang 29 can be removed using a selective etching process such as a plasma etching process even though this may result in a reduction of the thickness of the polycrystalline silicon layer 16 so that the layer tapers toward the edge 16a of the window 26 and even though the final dimensions of the window 26 will not be precisely controlled. For example, the remaining overhang 29 may be etched away in a conventional barrel reactor using a carbon tetrafluoride ($CF_4$) plasma containing about 8% oxygen and at a pressure of about 400 Torr ($5.3 \times 10^4$ Pa). A final short wet etching step may then be performed to remove the thin insulating layer 28 which protected the surface 3a within the window 25 during the plasma etching and also to smooth out the edge 14'a of the window 25.

The above described method thus enables a window to be opened in the relatively thick insulating layer 14a using a process which is relatively cheap and quick without the problem which would have arisen if a conventional simple wet etching technique had been used, Typically, such a method may comprise, where the relatively thick insulating layer is approximately 8000 Angstroms thick, an approximately 16 minute wet etch to open the window 25, a subsequent plasma etch for approximately three minutes to remove the overhang 29 and a final short, approximately twenty second, wet etch to remove the insulating layer 28.

As a modification of the method described, with reference to FIGS. 8 to 10, the window 26 may be opened after introduction of the impurities to form the relatively shallow outer subsidiary regions 7a, a photosensitive resist mask being used with a plasma etching technique to define the window 26 in the polycrystalline silicon layer. The insulating material layer 14a may then be wet etched with the photosensitive resist mask still in place and a plasma etching process used again to remove the polycrystalline silicon overhang 29. Such a method may have advantages in that, because the upper surface of the polycrystalline silicon layer remains protected by the photosensitive resist mask thinning of the polycrystalline silicon layer 15, 16 around the window 26 during removal of the overhang 29 may be reduced as the surface of the polycrystalline layer 15, 16 is protected by the photosensitive resist mask. In a typical process, the plasma etch through the photosensitive resist mask may have a duration of approximately 8.5 minutes, the subsequent wet etching step may have a duration of approximately 16 minutes and the final plasma etch may have a duration of approximately three minutes.

In the arrangement described above, the relative doses of impurities received by the first and second areas 31a and 31b are independently controlled by introducing the impurities to form the outer subsidiary region 7a of each second region 5 in two or more steps and masking the second area 31b of the given surface 3a after the first step. However, the doping can be controlled by controlling the relative doses received by the first and second areas 31a and 31b of the impurities introduced to form any one, two or all three of the regions 7a, 8 and 11.

Figure 11:
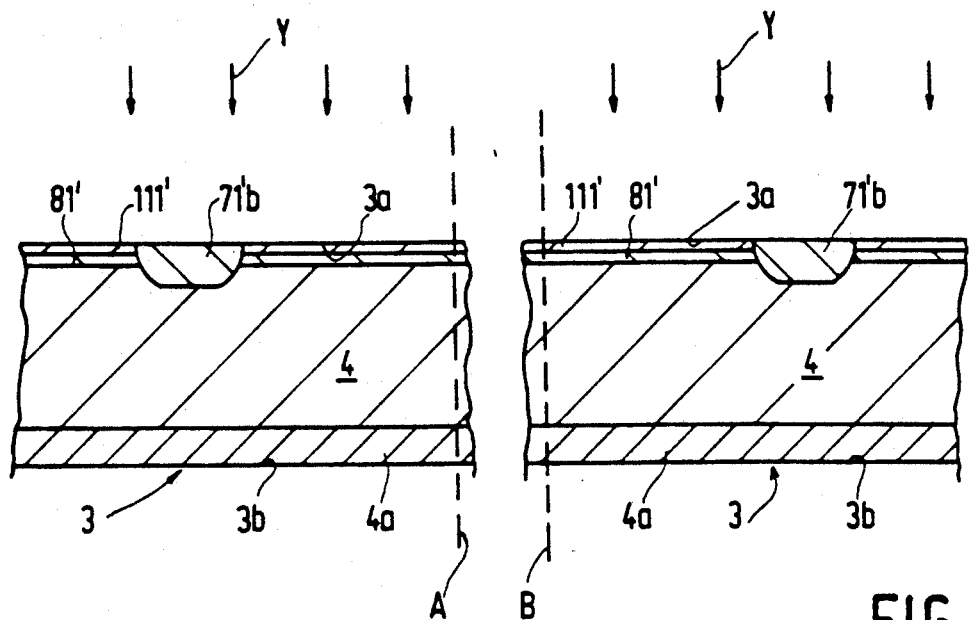
FIGS. 11 and 12 are schematic cross-sectional views illustrating steps in a second embodiment of a method in accordance with the invention for providing high voltage lateral enhancement and depletion IGFETs.
Figure 12:
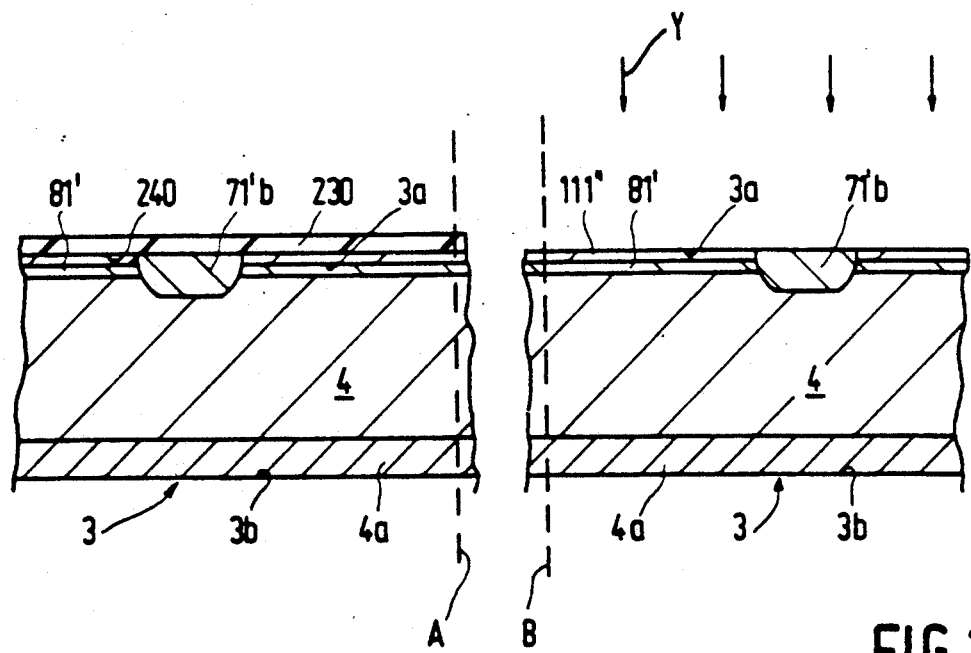

FIGS. 11 and 12 illustrate steps in a second embodiment of a method in accordance with the invention for independently controlling, using masking means, the relative doses of impurities received by the first and second areas 31a and 31b.

FIGS. 11 and 12 illustrate steps preceding the step shown in FIG. 1, that is prior to the heating of the semiconductor body in the oxidising atmosphere to drive in partially the introduced impurities and, at the same time, to form the field oxide or relatively thick insulating layer 140.

It should of course be appreciated that FIGS. 11 and 12 are merely schematic and that the various depths and dimensions of the implanted or implanted and partially diffused regions will depend on various processing variables such as the implantation energy and dose and diffusion temperature and time. Thus, the relative sizes of the regions on FIGS. 11 and 12 as compared with say FIG. 1 should be taken merely to indicate that further processing involving diffusion, in particular the simultaneous driven and field oxide formation, occurs between the stage shown in FIG. 12 and that shown in FIG. 1.

At the stage or step shown in FIG. 11, p-type impurities have been locally implanted through the given surface 3a and then partially driven in to provide two p-type precursor regions 71'b which will subsequently form the regions 71b and finally the relatively deep highly doped regions 7b. The p-type impurities for forming the central subsidiary regions 8 have also been implanted as indicated schematically by the precursor regions 81' which will, after subsequent processing, form the regions 81 and finally the central subsidiary regions 8. In accordance with this modified method, the impurities for forming the lightly doped drain extension regions 11 are introduced in two steps. Thus as indicated by the arrows Y in FIG. 11, a first dose of n type impurities, arsenic in this example, is implanted into the given surface 3a where both the enhancement and the depletion mode IGFETs 1 and 2 are being formed so that the n type impurities are received by both the first and the second areas 31a and 31b. This implantation is indicated by the precursor regions 111' in FIG. 11. Next as illustrated in FIG. 12, the area 240 of the given surface where the enhancement mode IGFET 1 is being formed is covered by an appropriate mask 230, for example a relatively thick layer of deposited oxide, to protect it against further implementation. A second implantation of n type impurities, again arsenic in this example, is then carried out so that the area is for the depletion mode IGFETs being formed, and receives at least one further dose of n type impurities to provide a precursor region 111" which is more highly doped than the precursor region 111'.

The second embodiment of a method in accordance with the invention then proceeds, after removal of the mask 230, as described above with respect to FIGS. 1 to 10 with the exception that in this example a single dose of p type impurities may be used to form the relatively shallow outer subsidiary regions 7a and thus the step illustrated in FIG. 4 may be omitted.

The first and second doses of n type impurities for forming the relatively lightly doped drain extension region 11 are selected so that, in the first area 31a where only the first dose is received, the subsequent introduction of p type impurities to form the outer subsidiary regions 7a overdopes the n type conductivity material to provide a p conductivity type channel area 13 while at the second area 31b which receives both doses of n type impurities, the dose of p type impurities introduced to form the outer subsidiary regions 7a is insufficient to cause overdoping and the channel area 13' remains n type thereby enabling the depletion mode IGFET 2 to be formed. Where the dose of impurities used to form the central subsidiary regions 8 is about $8 \times 10^{12}$ atoms $cm^{-2}$ with an implantation energy of 170 keV and the dose of impurities used to form the outer subsidiary regions 7a is a dose of about $1 \times 10^{13}$ atoms $cm^{-2}$ of boron with an implantation energy of about 180 keV then the first dose of n type impurities for forming the lightly doped drain extension regions 11 may be from 2 to $3 \times 10^{12}$ arsenic atoms $cm^{-2}$ at 170 keV and the second dose may be from 4 to $5 \times 10^{12}$ arsenic atoms $cm^2$ at 170 keV.

This control of the introduction of the impurities to form the relatively lightly doped drain extension regions 11 may be in addition to or in place of control of the introduction of the impurities to form the outer subsidiary regions 7a. Alternatively or additionally, the doping could be controlled by introducing the impurities for forming the central subsidiary regions 8 of the second regions 5 in two or more steps and the masking second area 31b after the first step. As an alternative to introducing the impurities to form the lightly doped drain extension regions 11 in two or more steps, the channel area 13 of the enhancement IGFET may be masked throughout the introduction of the impurities to form the drain extension regions 11 although this would require careful alignment of the mask used to provide the drain extension regions 11 with the subsequent insulated gate and would be subject to the usual manufacturing tolerances. In each case, the relative doses will be such that a p-type channel area 13 is formed for the IGFET 1 and an n-type channel area 13' is formed for the IGFET 2.

The enhancement and depletion mode lateral insulated gate field effect transistors 1 and 2 described above may be the only semiconductor components being formed in or on the semiconductor body 3. It will, however, be appreciated that more than one of the enhancement and/or the depletion mode insulated gate field effect transistors 1 and 2 may be formed in the semiconductor body 3 at the same time. Also, a method embodying the invention may be used to manufacture one or more IGFETs of either the depletion or the enhancement type, the method having the advantage of enabling a change from manufacturing one type of transistor to manufacturing the other type relatively simply and easily.

One or more further semiconductor components may be manufactured in or on the semiconductor body with the enhancement and depletion mode IGFETs 1 and 2. Thus, for example, one or more high power semiconductor components may be provided in the same semiconductor body 3, as may one or more low voltage logic type semiconductor components enabling the production of a so-called intelligent power switch, that is a semiconductor device in which logic circuitry for controlling operation of a high power semiconductor device is incorporated in or on the same semiconductor body for use in controlling power supply to lights, electric motors etc. under the control of logic signals from a central control circuit. For example, a simple bus system and such intelligent power switches may be used to replace the traditional loom used for distributing power in motor vehicles.

A method embodying the invention may have particular advantages where a power MOSFET of the vertical type is to be incorporated in the same semiconductor body 3.

FIG. 13 illustrates part of a semiconductor device in which a vertical insulated gate field effect transistor in the form of a power MOSFET 50 is integrated with one or more enhancement and/or depletion mode lateral IGFETs 1 and/or 2 of the type described above. In the interests of simplicity only part of one lateral IGFET, an enhancement lateral IGFET 1, is shown in FIG. 13.

A vertical power MOSFET is so called because the source and drain contacts are on opposite surfaces of the semiconductor body so that current flow is in a vertical direction through the semiconductor body. Such a vertical power MOSFET is normally made up of many hundreds of parallel-connected MOSFET cells having a common drain region and it should be appreciated that in the interests of simplicity FIG. 13 shows only a small part of the vertical power MOSFET 50.

As shown in FIG. 13, a cell of the vertical power MOSFET 50 consists of a body region 57 of the first conductivity type formed within the n-type semiconductor body 3. The body region 57 has a relatively deep relatively highly doped region 57b and a surrounding relatively shallow outer region 57a. A source region 59 of the first conductivity type (n type in this example) is provided within the body region 57 adjacent the given surface and an insulated gate structure 512 overlies channel areas 513 of the body region 57 to provide a gateable connection to the drain region, the drain contact being provided by the metallisation 20 mentioned above.

As should be appreciated from the above, the vertical power MOSFET may be manufactured using the methods described above at the same time as the lateral insulated gate IGFETs 1 and 2 by appropriate mask modification. Thus, the impurities to introduce the relatively deep region 57b may be introduced at the same time as the impurities to form the relatively deep regions 7b, the area 31c of the given surface 3a in which the power MOSFET is being manufactured then being masked during introduction of the impurities to form the regions 8 and 11. The insulated gate structure 512 may similarly be formed at the same time as the insulated gate structures 12 and the impurities to form the relatively shallow region 57a and source region 59 may similarly be introduced using the insulated gate structure 512 as a mask at the same time as the impurities to form the relatively shallow outer subsidiary regions 7a and the source regions 9, the gate structure 512 of the power MOSFET being protectively masked during the opening of the window 25.

As will be appreciated the masking of the area 31c during the introduction of the impurities to and/or from the lightly doped drain extension regions 11 means that the channel areas 513 of the power MOSFET 50 will be more highly p type doped and will have a higher threshold voltage than the enhancement mode lateral IGFETs. If this is not desirable, then the area 31c may be expressed to the impurities introduced to form the lightly doped drain extension regions 11 so as to reduce the threshold voltage of the power MOSFET 50.

The source metallisation 518 and gate metallisation (not shown) for the power MOSFET 50 may be provided at the same time as the source and drain metallisation 18 and 19 and gate metallisation (not shown) of the IGFETs 1 and 2 by depositing metal, after opening the necessary windows in the insulating layer 17, and then appropriately patterning the deposited metal.

As will be appreciated by those skilled in the art, each source region 59 of the power MOSFET 50 should be shorted to the associated body region 57 so as to inhibit parasitic bipolar action. This may be done by, for example, masking the source implant so that a central portion of the body region 57 extends to the given surface 3a or, as shown in FIG. 11, by etching away a central portion of the source region 57 using an appropriate photolithographic and etching process to expose the central portion of the body region 57 before depositing the metal to form the source metallisation 518.

Although the edges of the conductive gate layer 15, 16 have been illustrated as being straight or vertical, the edges especially of any power MOSFET gate layer may be bevelled or tapered using a technique such as that described in Siemens Forschungs und Entwicklungs Berichte Bd. 9(1980) Nr 4 at page 192.

The geometry of the various regions when viewed in plan may be circular, square (or rectangular) with rounded corners or hexagonal or any other suitable shape but for convenience all the regions should have the same geometry. Thus, for example, if a power MOSFET having a checkerboard type pattern of square cells (i.e. square (with rounded corners) outline body and source regions) is desired then the IGFET regions should have a similar outline or geometry and the outline or geometry of the subsidiary region 7 and the source region 9 having a square frame (with rounded corners) shape.

The relatively deep region 57b is desirable to reduce the on resistance of the vertical power MOSFET 50 but the relatively deep regions 7b may be omitted from the lateral IGFETs 1 and 2 so that the outer subsidiary region 7 of each second region 5 is formed solely by the relatively shallow region 7a. Where the relatively deep regions 7b are provided, the method described above of introducing the relatively deep regions 57b or 7b has particular advantages in that it enables the lightly doped central subsidiary region 8 of the second region and the lightly doped drain extension region 11 which require delicate control to be introduced near the beginning of the manufacturing process rather than as is normal as the last diffusion step. This is particularly advantageous in that it enables self-alignment of the source regions 9 and relatively shallow outer subsidiary regions 7a (and source regions 59 and regions 57b if present) to the insulated gate structures 12 (and the insulated gate structure 512 if present) resulting in a precisely defined and hence short channel length. A method embodying the invention could however be used where the lowly doped regions 8 and 11 are introduced as last diffusion/implantation steps and then the insulated gate structure formed, although alignment tolerances would mean that channel lengths and hence on resistances would be larger if such a non-aligned method were used.

In the arrangement described above, the enhancement and depletion mode IGFETs are high voltage lateral IGFETs designed for use in an intelligent power switch where the drain contact of the integrated power MOSFET 50 is to be connected to the positive supply terminal of, for example, a motor vehicle battery and the IGFET connected between the supply terminals of the battery so that a voltage equal or nearly equal to the battery voltage exists across the IGFET in operation of the intelligent power switch. In such circumstances, the enhancement and depletion mode IGFETs need to be capable of withstanding high voltages and therefore the lightly doped or RESURF region 8 is included to enable the IGFETs to withdrawal the high reverse voltages which may occur when the source 9 (or drain 10 if the conductivity types given above are reversed) and substrate 3 are at the positive supply voltage and the drain 10 (or source 9 if the conductivity types given above are reversed) is at the negative supply voltage, (normally around and the lightly doped or RESURF region 11 is included to enable the IGFETs to withstand the high reverse voltage occurring when the IGFET is off and the substrate 3 is at the positive battery supply voltage. Normally the voltage difference across the supply terminals of the battery would be 12 V (volts) or 24 V but the IGFETs need to be able to cope with voltages spikes and so for such a use they are designed to cope with higher reverse voltages, for example up to 50 V.

In addition to the lightly doped or RESURF regions 8 and 11, the high voltage lateral IGFETs should have a field relief edge termination system similar to that of the power MOSFET. Any suitable edge termination system may be used and the system selected will depend on the desired breakdown voltage of the device. For example, one or more field relief annular regions (not shown) formed at the same time as the relatively deep regions 7b and 57b may surround the active device area of the power MOSFET 50. The polysilicon gate layer may be extended outwardly up onto an extension 14'a of the relatively thick insulating layer to provide a field plating effect and the source metallisation similarly may be extended outwardly over the insulating layer 17 to provide a field plating effect. Each of the lateral IGFETs may have a similar field plate structure to the power MOSFET 50.

As will be appreciated from the above, the need for field plate systems to provide field relieving edge termination systems will apply not only to the high voltage lateral IGFET and the power MOSFET components of an intelligent power switch but to other required components such as zener diodes D1 to control and limit the gate source voltage of the IGFETs (FIG. 14a). If such diodes were each formed individually in the semiconductor body, a considerable amount of space would be taken up by the field plate systems. One solution would be to build all the zener diodes in a single isolation well but this is not economical when the subsequent wiring pattern is considered. Accordingly, the present inventors have devised a method of incorporating such a zener diode into the lateral high voltage IGFETs described above which enables the methods described above to be used with very little modification and results in a structure which is of similar size to the unmodified lateral high voltage IGFET shown in FIG. 7.

FIG. 14 illustrates such a modified lateral high voltage IGFET 1'. As can be appreciated from FIG. 13, the structure is modified by modifying the mask used when introducing the impurities to form the source region so as to provide a further region 60 of the first conductivity type in the relatively shallow outer subsidiary region 7a of the second region 5 so that the further region 60 is separated from the source region 9. As shown, the further region 60 is provided only at the right hand side of the FIG. 13 and does not extend completely around the source region. The further region 60 forms the zener diode D1 with the relatively shallow outer subsidiary region 7a which is shorted to the source region 9 in the usual manner. The outer subsidiary region 7a may be extended on the right hand side in FIG. 14 to accommodate the further region 60.

The only other modification required is during the opening of the windows in the insulating layer 17 and the subsequent patterning of the deposited metallisation to provide a contact 61 to the region 60. The contact 61, although not shown in FIG. 14, connects or is integral with gate metallisation (not shown) of the IGFET.

The lateral IGFETs need not necessarily be high voltage components. Where a high reverse-voltage withstanding capability is not required, the region 11 may be a lightly extension or drift region of the drain region 10 and may not necessarily be a RESURF region while the region 8 may merely form part of an isolation well isolating the IGFET from the substrate where such isolation is not necessary, the region 8 could be omitted as could any field plate structure.

The conductivity types given above may of course be reversed and the semiconductor body may be formed of a material other than silicon. Furthermore, the power MOSFET, if provided, may be replaced by any other suitable type of MOS-gated power device.

From reading the present disclosure, other modifications will be apparent to persons skilled in the art. Such modifications may involve other features which are already known in the design and manufacture of semiconductor devices and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization or modification of one or more of those features, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device having at least an enhancement mode IGFET and a depletion mode IGFET comprising the steps of
   (a) introducing impurities into a first region of a first conductivity type adjacent a surface of a semiconductor body,
   said step of introducing forming for each IGFET (i) a second region of a second conductivity type adjacent said surface, said second region including two areas of different doping; (ii) a source region of said first conductivity type adjacent said surface, said source region being surrounded by said second region; and (iii) a drain region of said first conductivity type, said drain region having a relatively lightly doped drain extension region adjacent said surface, said drain extension region extending toward said source region;
   (b) forming a first insulated gate on a first portion of said surface, said first insulated gate overlying a first channel area in one of said two areas of said second region of one of said IGFET's, said first channel area providing a first connection between the respective said source region and drain region of one of said IGFET's;

(c) forming a second insulated gate on a second portion of said surface, said second insulated gate overlying a second channel area in said one of said two areas of said second region of the other of said IGFET's, said second channel area providing a second connection between the respective said source region and drain region of said other IGFET;

said method further comprising (d) independently forming at least portions of said respective IGFET's by implanting relative doses of said impurities to provide both said second regions and said relatively lightly doped drain extension regions of each IGFET, said first channel area of said second conductivity type being formed adjacent said first portion of said surface of said one IGFET and said second channel area of said first conductivity type being formed adjacent said second portion of said surface of said other IGFET.

2. A method according to claim 1, wherein said step (d) is carried out by exposing both said first portion and said second portion to said impurities to form said relatively lightly doped drain extension region, by introducing said impurities to form said one of said two areas of different doping of each second region upon masking said second area, and thereafter by continuing introduction of said impurities to form said one of said two areas adjacent said first portion.

3. A method according to claim 2, wherein said step (d) is further carried out by providing impurities to form another of said two areas of different doping of said second region, and by providing said relatively lightly doped drain extension region and said drain region in said another of said two areas of each said second region.

4. A method according to claim 3, wherein said step (d) is carried out by providing said impurities to form said another of said two areas of each second region in two or more steps, and by masking said second portion of said surface after a first of said steps.

5. A method according to claim 1, wherein said steps (b) and (c) are carried out for each respective insulated gate by forming a thick insulating layer region over said relatively lightly doped drain extension region and a relatively thin insulating layer region over said first and second channel areas, and then by depositing an electrically conductive material layer over said insulating layer regions.

6. A method according to claim 5, wherein said step (d) is carried after forming said insulated gates by the steps of opening a window in said conductive material layer over said thick insulating layer region, isotropically etching said thick insulating layer region through said window to form a further window in said thick insulating layer region such that said conductive layer overhangs edges of said further window, selectively etching to remove overhanging parts of said conductive layer, and then introducing said impurities to form said drain regions using said insulated gates as a mask.

7. A method according to claim 6, wherein said step of etching said thick insulating layer region is carried out by wet etching, and wherein said step of etching to remove said overhanging parts is carried out by plasma etching.

8. A method according to claim 6, wherein for each IGFET, step (a) is carried out by introducing impurities of said second conductivity type to form a deep highly doped central region of said one of said different doped areas of said second region, by causing said impurities to partially diffuse into said semiconductor body, by introducing impurities to form said relatively lightly doped drain extension regions in said sub-step (iii), then by heating said semiconductor body in an oxidizing atmosphere to diffuse said impurities into said semiconductor body to provide both said deep highly doped central region and said relatively lightly doped drain extension region, and then by growing said thick insulating layer region over said relatively lightly doped drain extension region.

9. A method according to claim 1, wherein said step (a) is carried out to form said relatively lightly doped drain extension region of each IGFET in at least two steps, and wherein said first portion of said surface is masked after a first of said at least two steps.

10. A method according to claim 1, wherein said step (a) is carried out by masking the region for first and second channel areas for said enhancement IGFET throughout formation of said relatively lightly doped drain extension region.

11. A method according to claim 1, wherein for at least one of said IGFET's, further steps are carried out of introducing impurities into said second region to provide a further region of said first conductivity type, said further region being spaced from said source region by remaining parts of said second region, providing an electrical connection between said further region and the insulated gate of said one IGFET, and shorting said source region to said second region to provide a Zener diode between said insulated gate and said source region.

* * * * *